(12) United States Patent
Sugawara et al.

(10) Patent No.: US 12,084,788 B2
(45) Date of Patent: Sep. 10, 2024

(54) METHOD FOR PRODUCING A SILICON SINGLE CRYSTAL DOPED WITH NITROGEN AND HAVING A CONTROLLED AMOUNT OF CARBON IMPURITIES

(71) Applicant: SHIN-ETSU HANDOTAI CO., LTD., Tokyo (JP)

(72) Inventors: Kosei Sugawara, Nishigo-mura (JP); Ryoji Hoshi, Nishigo-mura (JP); Tomohiko Ohta, Shirakawa (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 122 days.

(21) Appl. No.: 17/794,039

(22) PCT Filed: Dec. 1, 2020

(86) PCT No.: PCT/JP2020/044655
§ 371 (c)(1),
(2) Date: Jul. 20, 2022

(87) PCT Pub. No.: WO2021/166361
PCT Pub. Date: Aug. 26, 2021

(65) Prior Publication Data
US 2023/0047427 A1  Feb. 16, 2023

(30) Foreign Application Priority Data

Feb. 18, 2020 (JP) ................. 2020-024862

(51) Int. Cl.
| | | |
|---|---|---|
| *C30B 15/04* | (2006.01) | |
| *C30B 15/20* | (2006.01) | |
| *C30B 29/06* | (2006.01) | |

(52) U.S. Cl.
CPC ............. *C30B 29/06* (2013.01); *C30B 15/04* (2013.01); *C30B 15/20* (2013.01)

(58) Field of Classification Search
CPC ......... C30B 15/00; C30B 15/02; C30B 15/04; C30B 15/20; C30B 29/00; C30B 29/02; C30B 29/06
(Continued)

(56) References Cited

U.S. PATENT DOCUMENTS

| 6,468,881 B1 | 10/2002 | Kubo et al. |
| 2001/0029883 A1 | 10/2001 | Minami et al. |
(Continued)

FOREIGN PATENT DOCUMENTS

| CN | 105316767 A | 2/2016 |
| JP | S60-251190 A | 12/1985 |
(Continued)

OTHER PUBLICATIONS

Feb. 16, 2021 International Search Report issued in International Patent Application No. PCT/JP2020/044655.
(Continued)

*Primary Examiner* — Kenneth A Bratland, Jr.
(74) *Attorney, Agent, or Firm* — Oliff PLC

(57) ABSTRACT

A method for producing a silicon single crystal, wherein a silicon nitride powder is introduced into a raw material before start of melting and the silicon single crystal doped with nitrogen is pulled by Czochralski method, wherein nitrogen doping is performed while an upper limit amount of usable silicon nitride powder is limited based on an amount of carbon impurities contained in the silicon nitride powder so that a carbon concentration in the silicon single crystal is equal to or less than allowable value. This makes it possible to achieve the required nitrogen doping amount at low cost while achieving the low carbon-concentration specification.

12 Claims, 1 Drawing Sheet

(58) Field of Classification Search
USPC .............. 117/11, 13, 19, 21, 30, 35–36, 928, 117/931–932
See application file for complete search history.

(56) References Cited

U.S. PATENT DOCUMENTS

| | | | | |
|---|---|---|---|---|
| 2007/0266930 | A1* | 11/2007 | Hoshi | C30B 29/06 117/19 |
| 2010/0242832 | A1 | 9/2010 | Takase | |
| 2014/0379276 | A1* | 12/2014 | Hoshi | G01N 33/00 702/23 |
| 2017/0253993 | A1 | 9/2017 | Xiao et al. | |

FOREIGN PATENT DOCUMENTS

| | | | |
|---|---|---|---|
| JP | H05-294780 | A | 11/1993 |
| JP | H11-189493 | A | 7/1999 |
| JP | H11-195565 | A | 7/1999 |
| JP | H111955565 | A * | 7/1999 |
| JP | 2001-199794 | A | 7/2001 |
| JP | 2009-269779 | A | 11/2009 |
| JP | 5262257 | B2 | 8/2013 |
| JP | 2016-088822 | A | 5/2016 |
| JP | 6142054 | B1 | 6/2017 |
| KR | 2009-0079419 | A | 7/2009 |
| KR | 2010-0039447 | A | 4/2010 |

OTHER PUBLICATIONS

Aug. 23, 2022 International Preliminary Report on Patentability issued in International Patent Application No. PCT/JP2020/044655.
Mar. 25, 2024 Office Action issued in Korean Patent Application No. 2022-7027841, with partial English translation.
Apr. 26, 2024 Office Action issued in German Patent Application No. 11 2020 006 111.6, with partial English translation.

* cited by examiner

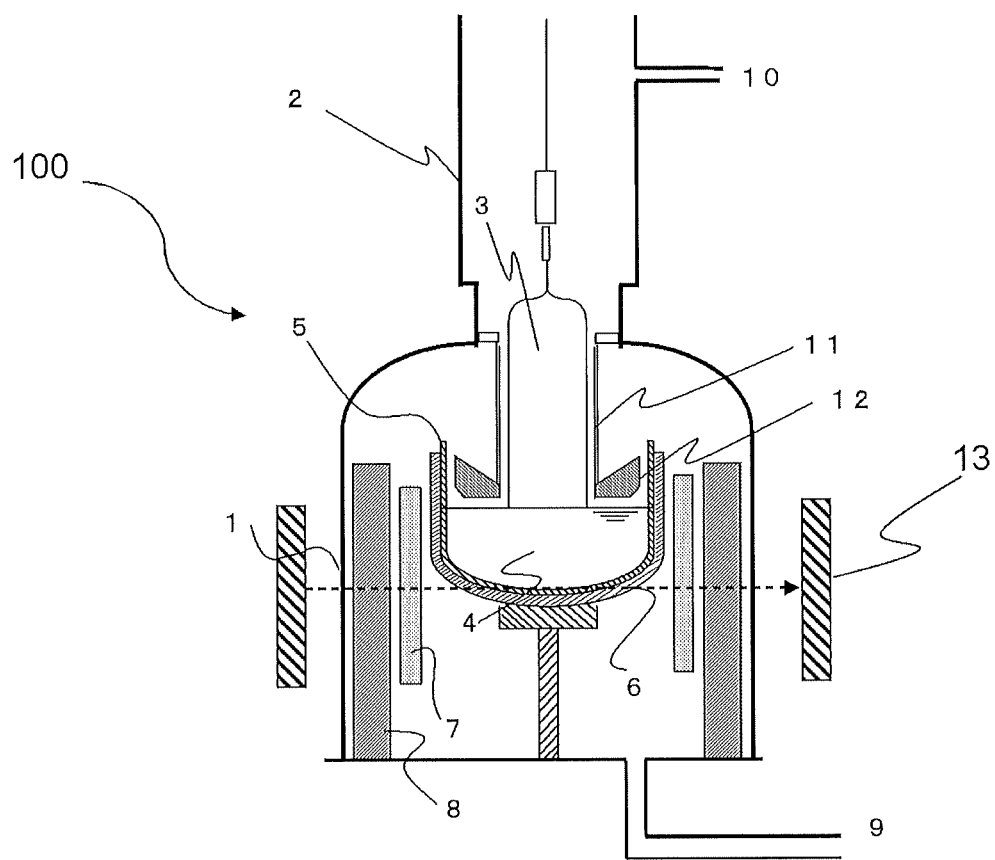

METHOD FOR PRODUCING A SILICON SINGLE CRYSTAL DOPED WITH NITROGEN AND HAVING A CONTROLLED AMOUNT OF CARBON IMPURITIES

TECHNICAL FIELD

The present invention relates to a method for producing a silicon single crystal.

BACKGROUND ART

Conventionally, generation of slip (dislocation) in a silicon wafer due to heat treatment during a semiconductor device manufacturing process may cause a decrease in yield of a final product.

The slip dislocation is a defect formed by deformation of silicon crystal structure in a length from several millimeters to several centimeters, which starts from mechanical damage that occurs when a silicon single crystal wafer comes into contact with a support member, and is formed due to the stress caused by weight of the wafer itself, stress generated during thermal deformation, and addition of thermal energy of high temperature.

Patent Document 1 discloses that nitrogen doping is effective as a countermeasure against thermal stress due to heat treatment in such a semiconductor device manufacturing process.

There are various methods for doping nitrogen, but in Czochralski method (CZ method), a nitride is mixed with melt, and in order to obtain a high purity silicon wafer, the nitride used must be of high purity. In addition, it is important to accurately control the doping amount of the nitride in order to control the concentration of nitrogen contained in the silicon wafer.

For example, in Patent Document 1, a silicon nitride powder sintered body (having sintering aid added), silicon powder unmolded body being directly nitrided, and nitrogen gas or a nitrogen compound gas being sprayed onto polycrystalline silicon before melting are disclosed as nitrogen source. However, the silicon nitride powder sintered body (having sintering aid added) has a problem in purity, and the direct nitriding of silicon powder or the raw material before melting is to be rate-determined by surface reaction and there may be a problem that a concentration control becomes difficult because the amount of nitride fluctuates, unless it is precisely temperature controlled.

On the other hand, in Patent Document 2, it is disclosed that using a nitride film formed by nitriding a high purity silicon wafer as a nitrogen source becomes suitable as a nitrogen source for semiconductor silicon production in terms of purity by, and a concentration control is also possible because the thickness of the nitride film is also controlled by temperature control. However, when a large amount of silicon raw material for producing a crystal with a large diameter is used, a large amount of silicon wafers with the nitride film are required, which causes a problem of high cost.

As another nitrogen doping method, Patent Document 3 discloses a method using high purity silicon nitride powder. However, even in the case of high purity silicon nitride powder obtained by the gas-phase reaction between silicon tetrachloride and ammonia, by which the highest purity silicon nitride can be obtained industrially, the carbon impurities contained in relatively high concentration is harmful to achieve the low carbon-concentration specification required for silicon single crystals for semiconductors, and there is a problem of low yield and high cost when a large amount of nitrogen doping is required.

CITATION LIST

Patent Literature

Patent Document 1: JP S60-251190 A
Patent Document 2: JP H05-294780 A
Patent Document 3: JP 5262257 B
Patent Document 4: JP H11-195565 A

SUMMARY OF INVENTION

Technical Problem

As described above, among the conventional nitrogen doping methods, the method using silicon wafers with nitride film requires a large amount of silicon wafers with nitride film when using a large amount of silicon raw material for producing a crystal with large diameter. Therefore, there is a problem in terms of cost. Further, when high purity silicon nitride powder is used, there is a problem that carbon impurities contained in relatively high concentration have an adverse effect on achieving the low carbon-concentration specification required for silicon single crystals for semiconductors.

To solve such a problem, the present invention provides a nitrogen doping method for performing the required nitrogen doping at low cost while controlling the carbon impurity concentration of the silicon nitride powder within an allowable range.

That is, an object of the present invention is to provide a method for producing a single crystal silicon, which can realize a required nitrogen-doping amount at low cost while achieving a low carbon-concentration specification.

Solution to Problem

In order to achieve the above mentioned object, the present invention provides a method for producing a silicon single crystal, wherein a silicon nitride powder is introduced into a raw material before start of melting and the silicon single crystal doped with nitrogen is pulled by Czochralski method, wherein nitrogen doping is performed while an upper limit amount of usable silicon nitride powder is limited based on an amount of carbon impurities contained in the silicon nitride powder so that a carbon concentration in the silicon single crystal is equal to or less than allowable value.

In the single crystal production method of the present invention, by limiting the upper limit of the usable silicon nitride powder so that the carbon-concentration in the silicon single crystal is equal to or less than the allowable value based on the amount of carbon impurities contained in the silicon nitride powder, the introduced amount of the silicon nitride powder that can achieve the carbon impurity concentration within the allowable range can be determined. Further, in the single crystal manufacturing method of the present invention, the same amount of nitrogen-doping can be realized at a lower cost than when only silicon wafers with nitride film are used as nitrogen source. Therefore, according to the single crystal production method of the present invention, the required nitrogen-doping amount can be realized at low cost while achieving the low carbon-concentration specification.

The upper limit amount of the usable silicon nitride powder can be set to, for example, satisfy following formula (1):

{the upper limit amount [g]×(a carbon impurity concentration in the silicon nitride powder [wt. %]/100)/carbon atomic weight [g/mol]}/a charge amount [mol] of the silicon raw material≤0.32×10$^{-6}$ (1).

By determining the upper limit of the usable silicon nitride powder so as to satisfy the above formula (1), a single crystal silicon conforming to the low carbon-concentration specification of 0.10 ppma or less, which is often required for a semiconductor device, can be produced.

Alternatively, the upper limit amount of the usable silicon nitride powder can be set to, for example, satisfy a following formula (2):

{the upper limit amount [g]×(a carbon impurity concentration in the silicon nitride powder [wt. %]/100)/carbon atomic weight [g/mol]}/a charge amount of the silicon raw material [mol] ≤0.16×10$^{-6}$ (2).

By determining the upper limit of the usable silicon nitride powder so as to satisfy the above formula (2), it is possible to meet the requirement for a silicon wafer having a lower carbon concentration, for example, a low carbon-concentration specification of 0.05 ppma or less.

The upper limit amount of the silicon nitride powder may be obtained from an actual value of a carbon concentration in a silicon single crystal produced by doping of the silicon nitride powder.

By doing so, it is possible to more reliably achieve the carbon impurity concentration within the permissible range.

Only the silicon nitride powder is doped as a nitrogen source when the upper limit amount is equal to or greater than a required nitrogen-doping amount, or an insufficient nitrogen-doping amount can be compensated by doping the raw material with a silicon wafer having a high purity nitride film when the upper limit amount is less than the required nitrogen doping amount.

That is, if the required amount of nitrogen doping is insufficient with the above amount of silicon nitride powder, it can be supplemented with high purity nitride film wafers obtained by nitriding high-purity silicon wafers.

By doing so, even when the required amount of nitrogen doping is high, the using amount of the silicon wafers with high purity nitride film can be minimized, and thus the required nitrogen doping amount can be realized at low cost while the low carbon-concentration specification can be achieved.

It is preferable that the silicon nitride powder is placed on a silicon wafer and weighed to the upper limit amount or less.

By doing so, it is possible to suppress the variation in the introduced amount due to adhesion to the weighing paper or the like at the time of weighing, and to accurately introduce the weighed amount of silicon nitride powder into the raw material.

Further, it is more preferable that the weighed silicon nitride powder is sandwiched by using another silicon wafer to form a doping agent and nitrogen is doped by adding the doping agent to the raw material before the start of melting.

By doing so, it is possible to suppress the variation in the introduced amount due to scattering and adhesion to the weighing paper or the like at the time of weighing, and to accurately introduce the weighed amount of silicon nitride powder into the raw material. That is, in the single crystal production method according to such a preferred aspect, the silicon nitride powder can accurately be weighed in the target amount capable of achieving the carbon impurity concentration within the allowable range, and the required amount of the silicon nitride powder can be accurately introduced into raw materials.

Advantageous Effects of Invention

As described above, according to the single crystal production method of the present invention, the required nitrogen-doping amount can be realized at low cost while achieving the low carbon-concentration specification.

BRIEF DESCRIPTION OF DRAWINGS

FIG. 1 is a schematic cross-sectional view showing an example of a crystal producing apparatus capable of carrying out the silicon single crystal producing method of the present invention.

DESCRIPTION OF EMBODIMENTS

The present invention relates to a method for manufacturing a silicon single crystal, specifically, a silicon single crystal for obtaining, for example, a silicon wafer, a silicon epitaxial wafer, an SOI wafer, and a heteroepitaxial wafer. From another aspect, the present invention relates to a method for producing a nitrogen-doped silicon single crystal by CZ method in which nitrogen doping is performed.

As described above, there has been a demand for the development of a method for producing single crystal silicon that can achieve the required nitrogen-doping amount at low cost while achieving the low carbon-concentration specification.

As a result of diligent studies on the above problems, inventors of the present invention have found that by limiting the upper limit of the usable silicon nitride powder so that the carbon concentration in the silicon single crystal is equal to or less than the allowable value, and the target nitrogen-doping amount can be achieved at low cost while achieving the low carbon-concentration specification by introducing silicon nitride powder into the raw material before the start of melting under this limitation to perform nitrogen doping, and completed the present invention.

That is, the present invention is a method for producing a silicon single crystal, wherein a silicon nitride powder is introduced into a raw material before start of melting and the silicon single crystal doped with nitrogen is pulled by Czochralski method, wherein nitrogen doping is performed while an upper limit amount of the usable silicon nitride powder is limited based on an amount of carbon impurities contained in the silicon nitride powder so that a carbon concentration in the silicon single crystal is equal to or less than allowable value.

Hereinafter, the present invention will be described in detail, but the present invention is not limited thereto.

<Silicon Single Crystal Producing Method>

First, a configuration example of a crystal producing apparatus capable of carrying out the silicon single crystal producing method of the present invention will be described with reference to FIG. 1. As shown in FIG. 1, the crystal producing apparatus 100 includes a main chamber 1 and a pulling chamber 2 connected to the upper part of the main chamber 1 and accommodating the grown silicon single crystal 3. Inside the main chamber 1, a quartz crucible 5 for accommodating the raw material melt 4 and a graphite crucible 6 for supporting the quartz crucible 5 are provided.

Further, the heater 7 which is the main heat source is arranged concentrically with the quartz crucible 5 and the graphite crucible 6. A heat insulating member 8 is provided on the outside of the heater 7. Further, the main chamber 1 is provided with a gas outlet 9, and the pulling chamber 2 is provided with a gas introduction port 10, and this configuration makes the introduction of an inert gas (for example, argon gas) or the like into the main chamber 1 and the pulling chamber 2 and the discharge of the inert gas or the like from the main chamber 1 and the pulling chamber 2. A cylindrical gas flow-guide cylinder 11 is provided above the surface of the raw material melt 4 so as to surround the silicon single crystal 3 being pulled. Further, the heat shield member 12 is provided above the melt surface of the raw material melt 4 so that the heat shield member 12 faces to the raw material melt 4. Further, the magnetic field application device 13 is provided on the outer peripheral portion of the main chamber 1.

Next, the method for producing a silicon single crystal of the present invention will be described in more detail.

In the silicon single crystal production method of the present invention, first, as an example, a crystal producing apparatus 100 as shown in FIG. 1 is used and a silicon raw material is supplied into a quartz crucible 5 to prepare for growth of a silicon single crystal. After heating and melting the silicon raw material, the growth axis direction of the silicon single crystal is set to, for example, <100>, and the silicon single crystal is grown while applying a magnetic field using the magnetic field application device 13, and the silicon single crystal is grown by normal CZ method, and thus a silicon single crystal can be produced.

In the present invention, silicon nitride ($Si_3N_4$) powder is introduced into the raw material before the start of melting, and the silicon single crystal is pulled by the Czochralski method.

Here, the upper limit of the amount of the silicon nitride powder to be introduced is limited based on the amount of carbon impurities contained in the silicon nitride powder so that the carbon concentration in the silicon single crystal is equal to or less than the allowable value.

As mentioned above, even in high purity silicon nitride powder, the concentration of carbon impurities is relatively high. On the other hand, in the single crystal producing method of the present invention, the upper limit of the usable silicon nitride powder is limited based on the amount of carbon impurities contained in the silicon nitride powder so that the carbon concentration in the silicon single crystal is equal to or less than the allowable value. By thus limiting, it is possible to determine the amount of silicon nitride powder to be introduced that can achieve the carbon impurity concentration within the allowable range.

And then, in the single crystal producing method of the present invention, a similar amount of nitrogen doping can be achieved at a lower cost than when only silicon wafers with nitride film are used as a nitrogen source, by performing nitrogen doping using the silicon nitride powder under thus controlling the upper limit amount of the usable silicon nitride powder.

Therefore, according to the single crystal producing method of the present invention, the required nitrogen-doping amount can be realized at low cost while achieving the low carbon-concentration specification.

Further, in the single crystal producing method of the present invention, it is preferable that the silicon nitride powder is weighed in a state of being placed on the silicon wafer to the upper limit amount or less thus limited as described above.

When the silicon nitride powder is weighed with a weighing paper or the like in the same manner as a normal doping agent, the silicon nitride powder having small particle size adheres to the surface of the weighing paper and remains on it, which may cause the nitrogen-doping amount to vary. On the other hand, by weighing the silicon nitride powder on a silicon wafer, it is possible to suppress the variation in the introduced amount due to the adhesion (residual) to the weighing paper or the like at the time of weighing.

In the single crystal producing apparatus of the present invention, it is more preferable that silicon nitride powder weighed on a silicon wafer is sandwiched by using another silicon wafer to form a doping agent, and this doping agent is put into a raw material before the start of melting (for example, to be placed on the raw material in the quartz crucible 5).

For example, since the high purity silicon nitride powders obtained by the gas-phase reaction between silicon tetrachloride and ammonia are fine particles of about several μm to 100 μm, it is difficult to dissolve into melt all of the used silicon nitride powders due to scattering during handling and melting process. Therefore, there is a problem that control of the doping amount of the nitride is difficult, and the doping amount may vary. To solve such a problem, Patent Document 4 discloses that silicon nitride powder is placed on the bottom of the crucible and doping is performed. However, in this method, it is not an effective solution because scattering of silicon nitride powder happens during charging polycrystalline silicon raw material after silicon nitride is charged on the bottom of the crucible. That is, conventionally, there has been a problem that it is difficult to accurately perform doping with the weighed amount, because when the silicon nitride powder is weighed on the weighing paper instead of on the silicon wafer, a part of the silicon nitride powder always remains on the weighing paper at the time of doping or when it is transferred to the silicon wafer to be used to sandwiching, and a part of silicon nitride powder scatters.

On the other hand, by forming a doping agent as described above and putting this doping agent into the raw material before the start of melting, it can be suppressed the variation in the introduction amount due to scattering during handling of the doping agent and during the melting process of the raw material, and due to adheres (residual) to the weighing paper or the like during weighing. This makes it possible to accurately introduce the weighed amount of silicon nitride powder into the raw material.

When using high purity silicon nitride powder, which has a small particle size and thus is easily scattered and easily adheres to a weighing paper or the like and remains on it, it is more effective to weigh it on a silicon wafer as described above and to perform doping it in a sandwiched form.

That is, in the above preferred aspect of the present invention, by using the doping agent prepared as described above, the silicon nitride powder is accurately weighed in a target amount capable of achieving carbon impurity concentration within an allowable range, and the required amount of silicon nitride powder can be accurately introduced into the raw material.

In the single crystal producing method of the present invention, the upper limit amount of the usable silicon nitride powder can be set to, for example, satisfy following formula (1):

$$\{\text{the upper limit amount [g]} \times (\text{a carbon impurity concentration in the silicon nitride powder [wt. \%]}/100)/\text{carbon atomic weight [g/mol]}\}/\text{a charge amount [mol] of the silicon raw material} \leq 0.32 \times 10^{-6} \quad (1).$$

By setting the upper limit of the usable silicon nitride powder so as to satisfy the above formula (1), a single crystal silicon conforming to the low carbon-concentration standard of 0.10 ppma or less, which is often required for a semiconductor device, can be produced. That is, the doping of the silicon nitride powder can be performed by limiting the amount of silicon nitride powder that can be used based on the above formula (1) so that the carbon concentration in the silicon wafer is 0.10 ppma or less.

Further, the carbon-concentration specification in the crystal used in the single crystal producing method of the present invention limits the concentration of carbon impurities in the silicon melt dominated by the silicon nitride powder, but if the limitation based on the above formula (1) is applied, it is possible to obtain a silicon wafer having a carbon concentration permitted in a grown crystal up to a solidification rate of 80% by weight of a charged raw material in the carbon concentration in the crystal due to the segregation phenomenon of the following formula (3) at the time of growing the silicon single crystal.

$$\text{Carbon concentration in crystal} = k0 \times \text{carbon concentration in melt (raw material melt)} \times (1-g)^{(k0-1)} \quad (3)$$

k0: segregation coefficient, g: solidification rate (=weight of grown crystal/weight of charged raw material)

Alternatively, in order to meet the demand of a lower carbon concentration for a silicon wafer, for example, in the production of a silicon wafer in a carbon-concentration specification of 0.05 ppma or less, it can be dealt with by adjusting (restricting) so as to satisfy the upper limit of the silicon nitride powder that can be used is set by the following formula (2):

$$\{\text{the upper limit amount [g]} \times (\text{a carbon impurity concentration in the silicon nitride powder [wt. \%]}/100)/\text{carbon atomic weight [g/mol]}\}/\text{a charge amount of the silicon raw material [mol]} \leq 0.16 \times 10^{-6} \quad (2).$$

The charge amount of the silicon raw material in the above formulas (1) and (2) is, for example, the total of the amount of silicon raw material [mol] before melting and the silicon amount [mol] of a silicon wafer including the doping agent in which the silicon nitride powder is sandwiched, the silicon raw material and the silicon wafer being in the quartz crucible 5. The carbon atomic weight is typically 12.01 [g/mol].

Should be noted that since the above formulas (1) and (2) are formulas used to obtain an example of the upper limit amount of the silicon nitride powder that can be used, lower limit value of the ratio in the above formulas (1) and (2) {the upper limit amount [g]×(carbon impurity concentration in the silicon nitride powder [wt. %]/100)/carbon atom weight [g/mol]}/silicon raw material charge amount [mol], is not particularly limited. The shortage of nitrogen dopant may be separately supplemented by using another nitrogen source such as a silicon wafer with high purity nitride film.

The upper limit of the usable silicon nitride powder may be obtained from the actual value of the carbon concentration in the silicon single crystal produced by performing doping of the silicon nitride powder. By doing so, it is possible to more reliably achieve the carbon impurity concentration within the permissible range.

Only the silicon nitride powder is doped as a nitrogen source when the upper limit amount is equal to or greater than required nitrogen doping amount, or insufficient nitrogen doping amount can be compensated by doping the raw material with silicon wafers having high purity nitride film when the upper limit amount is less than the required nitrogen doping amount. That is, if the required amount of nitrogen doping is insufficient with the above amount of silicon nitride powder (usable upper limit amount), it can be supplemented with high purity nitride film wafers obtained by nitriding a high purity silicon wafers.

By doing so, even when the required amount of nitrogen doping is large, the amount of silicon wafers with high purity nitride film which has to be used can be minimized. Therefore, the required nitrogen doping amount can be realized at low cost while achieving the low carbon-concentration specification.

As the silicon wafer with high purity nitride film, for example, the one described in Patent Document 2 can be used.

The required nitrogen doping amount (required nitrogen atom doping amount in the melt) can be obtained, for example, in consideration of the segregation of nitrogen atoms with respect to the nitrogen atom concentration in the target silicon single crystal.

The silicon wafer used for weighing the silicon nitride powder and producing the doping agent is not particularly limited as long as it can carry the silicon nitride powder. A lower cost can be achieved by using a silicon wafer with a smaller diameter. If the diameter of the silicon wafer used for weighing the silicon nitride powder and preparing the doping agent is, for example, 3 inches or more and 12 inches or less, the weight is less than 128 g. By using the silicon wafer, silicon nitride can be weighed with sufficient measurement accuracy by using a general electronic balance. But more preferably, a silicon wafer having a diameter of 3 inches or more and 8 inches or less, or a small piece obtained by cleaving a silicon wafer having a diameter of 4 to 12 inches can be used. In this way, the silicon nitride can be weighed with sufficient measurement accuracy, and the silicon nitride can be weighed according to the specifications of the sample chamber size and the measurable weight of the electronic balance. When using a small piece that has been cleaved, it is more desirable to use one that has been cleaned and mirror-etched in order to avoid the effects of contamination during cleavage. Further, the silicon wafer with a high purity nitride film used as a doping agent can also be used for weighing the silicon nitride powder and preparing the doping agent.

Should be noted that the silicon single crystal producing method of the present invention can also be performed using an apparatus other than the crystal producing apparatus 100 shown in FIG. 1. For example, the method for producing a silicon single crystal of the present invention may be carried out with an apparatus that does not include a magnetic field application device.

EXAMPLE

Hereinafter, the present invention will be specifically described with reference to Examples and Comparative Example, but the present invention is not limited thereto.

Comparative Example 1

In Comparative Example 1, four silicon single crystals (each having a diameter of 300 mm) were pulled under the following conditions while the nitrogen atom concentration in the crystal at the position where the solidification rate of 10% were $1 \times 10^{14}$ atoms/cm$^3$, $5 \times 10^{14}$ atoms/cm$^3$, $1 \times 10^{15}$ atoms/cm$^3$, and $2 \times 10^{15}$ atoms/cm$^3$, respectively.

First, silicon raw material and silicon wafers with nitride film as nitrogen source were placed in a quartz crucible having a diameter of 32 inches (800 mm). As the silicon wafers with nitride film used here, 8 inches PWs (mirror-polished wafers having a diameter of 200 mm) were directly nitrided to have nitride film with a thickness of 750 nm. After charging polycrystalline silicon as silicon raw material into the quartz crucible, it was doped by placing silicon wafers with nitride film on this raw material.

At this time, the numbers of wafers with nitride film used in order to obtain each silicon single crystal having a nitrogen atom concentration in the crystal at a solidification rate of 10% of $1\times10^{14}$, $5\times10^{14}$, $1\times10^{15}$, and $2\times10^{15}$ atoms/cm$^3$, respectively were 8.9 pieces, 44.3 pieces, 88.6 pieces, and 177.3 pieces, respectively.

The total weight of the charged silicon raw materials including the silicon wafers with the nitride film was set to 400 kg.

Next, the silicon raw material and the silicon wafers with the nitride film were melted to obtain a raw material melt. Silicon single crystals were pulled from these raw material melts and grown.

Then, samples having a thickness of 2 mm were taken from the positions where the solidification rate of the grown silicon single crystal were 10% and 80%, and these samples were surface-ground. In addition, the carbon concentration of the samples from the position of the solidification rate of 80% was measured by FTIR. Furthermore, the nitrogen atom concentration of the samples was measured from the position of the solidification rate of 10% by SIMS.

Example 1

In Example 1, four silicon single crystals were pulled in the same manner as in Comparative Example 1 except that a doping agent produced by sandwiching silicon nitride powder by using silicon wafers was used as the nitrogen source. Evaluation was performed in the same manner as in Comparative Example 1.

In Example 1, the silicon nitride powder was weighed on a 4 inches (100 mm diameter) silicon wafer at the time of weighing the silicon nitride powder, and after weighing, the silicon nitride powder was sandwiched by using another wafer to prepare a doping agent, and the doping agent was placed on a silicon raw material.

The upper limit of the usable silicon nitride powder was calculated to satisfy the formula {the upper limit amount [g]×(a carbon impurity concentration in the silicon nitride powder [wt. %]/100)/carbon atom weight [g/mol]}/a charge amount [mol] of the silicon raw material $16\times10^{-6}$ (2) in which the previously measured carbon impurity concentration of 0.2 wt. % of the used silicon nitride powder is used, such that the carbon impurity concentration in the silicon crystal at the position a solidification rate of 80% is 0.05 ppma or less. The upper limit of the usable silicon nitride powder obtained at this time was 13.684 g. On the other hand, the amounts of nitrogen doping required to obtain each silicon single crystal having a nitrogen atom concentration of $1\times10^{14}$, $5\times10^{14}$, $1\times10^{15}$, $2\times10^{15}$ atoms/cm$^3$ in the crystal at the position of a solidification rate of 10% were 1.323 g, 6.613 g, 13.226 g, and 26.452 g, respectively in terms of silicon nitride powder.

When producing silicon single crystals having the nitrogen atom concentration of $1\times10^{14}$ atoms/cm$^3$, $5\times10^{14}$ atoms/cm$^3$, and $1\times10^{15}$ atoms/cm$^3$ at the position of a solidification rate of 10%, the upper limit of the usable silicon powder was equal to or higher than the nitrogen dope amount required for the target nitrogen doping according to the calculation results. Therefore, 1.323 g, 6.613 g, and 13.226 g of the silicon nitride powders were used as the only nitrogen source, respectively. On the other hand, when producing a silicon single crystal having the nitrogen atom concentration of $2\times10^{15}$ atoms/cm$^3$, the upper limit of the usable silicon nitride powder was less than the nitrogen dope amount required for the target nitrogen doping. Therefore, 13.684 g of silicon nitride powder and 85.6 pieces of silicon wafers with nitride film were used as nitrogen source. As the silicon wafers with nitride film, the same one as that used in Comparative Example 1 were used. In Example 1, the total weight of the charged raw materials including the silicon wafers of the doping agent and the silicon wafers with the nitride film was set to 400 kg.

The evaluation results of Example 1 and Comparative Example 1 are shown in Table 1 below.

TABLE 1

| | | Nitrogen Concentration Target at Solidification Rate of 10% [atoms/cm$^3$] | | | |
|---|---|---|---|---|---|
| | | 1.00E+14 | 5.00E+14 | 1.00E+15 | 2.00E+15 |
| | Required Nitrogen Doping Weight [g] | 0.528 | 2.641 | 5.282 | 10.565 |
| Comparative Example 1 | Only Wafers with Nitride Film [wf] | 8.9 | 44.3 | 88.6 | 177.3 |
| | Cost of Nitrogen Doping [–/g Nitrogen] * Relative Value as Comparative Example is 1 | 1.00 | 1.00 | 1.00 | 1.00 |
| | Carbon Concentration at Solidification Rate of 80% [ppma] | 0.04 | 0.03 | 0.04 | 0.05 |
| Example 1 | Silicon Nitride (Carbon 0.2 wt. %) [g] | 1.323 | 6.613 | 13.226 | 13.684 |
| | + Wafers with Nitride Film [wf] | 0 | 0 | 0 | 85.6 |
| | Cost of Nitrogen Doping [–/g Nitrogen] * Relative Value as Comparative Example is 1 | <0.01 | <0.01 | <0.01 | 0.49 |
| | Carbon Concentration at Solidification Rate of 80% [ppma] | 0.03 | 0.04 | 0.04 | 0.05 |

In the four silicon single crystals obtained in each of Example 1 and Comparative Example 1, it was confirmed by SIMS that the nitrogen concentrations at the position of a solidification rate of 10% of the silicon single crystal pulled were as intended. Further, as shown in Table 1, it was confirmed that according to Example 1, the nitrogen doping cost required for the growth of silicon single crystals each having the nitrogen atom concentration at the position where the solidification rate of 10% were $1\times10^{14}$ atoms/cm$^3$, $5\times10^{14}$ atoms/cm$^3$, and $1\times10^{15}$ atoms/cm$^3$, could be reduced by 99% or more as compared with Comparative Example 1, and the nitrogen doping cost could be reduced by 51% as compared with Comparative Example 1 even for a silicon single crystal having a nitrogen atom concentration of $2\times10^{15}$ atoms/cm$^3$.

Further, it was confirmed that the carbon concentration at the position where the solidification rate of the silicon single crystal obtained in Example 1 was 80% was the same as that of the silicon wafers with nitride film, and that it could be used for semiconductor device manufacturing without any problem.

Example 2

As Example 2 of the additional confirmation, the growth of a silicon single crystal having a nitrogen atom concentration of $2\times10^{15}$ atoms/cm$^3$ at the position of the solidification rate of 10% was performed by using silicon nitride powder as the only nitrogen source (silicon nitride powder doping amount: 26.452 g). The doping amount was less than or equal to the upper limit calculated as the value satisfying the formula: {upper limit amount [g]×(a carbon impurity concentration in the silicon nitride powder [wt. %]/100)/carbon atomic weight [g/mol]}/a charge amount [mol] of silicon raw material≤$0.32\times10^{-6}$ (1). In this case, the nitrogen concentration was as intended, and the carbon concentration could be 0.05 ppma or less up to the position where the solidification rate was 60%. Further, the carbon concentration at the position where the solidification rate was 80% was 0.09 ppma, which exceeded 0.05 ppma but satisfied the low carbon-concentration specification of 0.10 ppma or less, which is often required for semiconductor devices.

Comparing Examples 1 and 2, it can be seen that the stricter low carbon-concentration specification can be satisfied if the upper limit is limited so as to satisfy the formula (2) as compared with the case where the upper limit is limited so as to satisfy the formula (1), although the low carbon-concentration specification can be achieved even if the upper limit is limited so as to satisfy the formula (1).

As described above, in order to meet the low carbon-concentration specification of silicon wafers with high yield and low cost, the amount of silicon nitride powder that can be used with respect to the target nitrogen atom concentration in the silicon single crystal is determined as in the present invention, and, if the amount of silicon nitride powder that can be used cannot satisfy the required doping amount of nitrogen atom in the melt, it is desirable to performing doping by using silicon nitride powder and silicon wafers with high purity nitride film as nitrogen source.

Example 3

In Example 3, four silicon single crystals were pulled in the same manner as in Example 1 except for the following points, and the same evaluation as in Example 1 was performed.

In Example 3, the silicon nitride powder was weighed in the same amount as that weighed in Example 1 with a weighing paper, and the weighed silicon nitride powder was charged into the bottom of the crucible, and then polycrystalline silicon was charged as a silicon raw material, and then these were melt. Then, each of the silicon single crystal was pulled.

The nitrogen concentration by SIMS of each of the four silicon single crystals obtained in Example 3 at the position where the solidification rate was 10% was within the allowable range, but was lower than the nitrogen concentration of the corresponding four silicon single crystals obtained in Example 1.

It is considered that, in Example 3, the silicon nitride powder adhered to the weighing paper at the time of weighing, and the silicon nitride powder was slightly scattered when it was charged into the bottom of the crucible. Therefore, it is considered that in Example 3, the amount of nitrogen actually doped was smaller than the amount to be doped with the weighed amount of silicon nitride powder.

On the other hand, in Examples 1 and 2, the amount that was doped with the weighed amount of silicon nitride powder sufficiently corresponded to the amount that was actually doped, that is, it can be suppressed variation of the amount of doping due to scattering and adhesion during weighing.

Although the amount of nitrogen doping achieved in Example 3 was lower than that in Example 1, it was within the permissible range as shown above. Further, the nitrogen doping cost of Example 3 is the same as the cost of Example 1, and the cost can be significantly reduced as compared with Comparative Example 1. Then, it was confirmed that the carbon concentration at the position where the solidification rate was 80% of the silicon single crystal obtained in Example 3 was equivalent to that of the silicon wafer with a nitride film and could be used for semiconductor device manufacturing without any problem. That is, even in Example 3, the target nitrogen doping amount could be realized at low cost while achieving the low carbon concentration specification.

As shown above, according to the present invention, the concentration of carbon impurities due to the silicon nitride powder can be controlled within an allowable range, and nitrogen doping method can be implemented at a low cost. That is, according to the present invention, it is possible to provide a method for producing single crystal silicon that can realize a required nitrogen doping amount at low cost while achieving a low carbon-concentration specification.

The present invention is not limited to the above embodiments. The above-described embodiments are just examples, and any examples that substantially have the same feature and demonstrate the same functions and effects as those in the technical concept disclosed in claims of the present invention are included in the technical scope of the present invention.

The invention claimed is:

1. A method for producing a silicon single crystal, wherein a silicon nitride powder is introduced into a raw material before start of melting and the silicon single crystal doped with nitrogen is pulled by Czochralski method, wherein nitrogen doping is performed while an upper limit amount of usable silicon nitride powder is set to satisfy a following formula (1):

{the upper limit amount [g]×(a carbon impurity concentration in the silicon nitride powder [wt.

%]/100)/carbon atomic weight [g/mol]}/a charge amount [mol] of the silicon raw material≤0.32×10⁻⁶     (1).

2. The method for producing a silicon single crystal according to claim 1, wherein the carbon impurity concentration in the silicon nitride powder is an actual value of a carbon concentration in a silicon single crystal produced by doping of the silicon nitride powder.

3. The method for producing a silicon single crystal according to claim 1, wherein only the silicon nitride powder is doped as a nitrogen source when the upper limit amount is equal to or greater than a required nitrogen doping amount, or insufficient nitrogen doping amount is compensated by doping the raw material with a silicon wafer having a high-purity nitride film when the upper limit amount is less than the required nitrogen doping amount.

4. The method for producing a silicon single crystal according to claim 2, wherein only the silicon nitride powder is doped as a nitrogen source when the upper limit amount is equal to or greater than a required nitrogen doping amount, or insufficient nitrogen doping amount is compensated by doping the raw material with a silicon wafer having a high-purity nitride film when the upper limit amount is less than the required nitrogen doping amount.

5. The method for producing silicon single crystal according to claim 1, wherein the silicon nitride powder is placed on a silicon wafer and weighed to the upper limit amount or less.

6. The method for producing silicon single crystal according to claim 2, wherein the silicon nitride powder is placed on a silicon wafer and weighed to the upper limit amount or less.

7. The method for producing silicon single crystal according to claim 5, wherein the weighed silicon nitride powder is sandwiched by using another silicon wafer to form a doping agent and nitrogen is doped by adding the doping agent to the raw material before the start of melting.

8. The method for producing silicon single crystal according to claim 6, wherein the weighed silicon nitride powder is sandwiched by using another silicon wafer to form a doping agent and nitrogen is doped by adding the doping agent to the raw material before the start of melting.

9. A method for producing a silicon single crystal wherein a silicon nitride powder is introduced into a raw material before start of melting and the silicon single crystal doped with nitrogen is pulled by Czochralski method,
wherein nitrogen doping is performed while an upper limit amount of usable silicon nitride powder is set to satisfy a following formula (2):

{the upper limit amount [g]×(a carbon impurity concentration in the silicon nitride powder [wt. %]/100)/carbon atomic weight [g/mol]}/a charge amount of the silicon raw material [mol] ≤0.16×10⁻⁶     (2).

10. The method for producing a silicon single crystal according to claim 3, wherein only the silicon nitride powder is doped as a nitrogen source when the upper limit amount is equal to or greater than a required nitrogen doping amount, or insufficient nitrogen doping amount is compensated by doping the raw material with a silicon wafer having a high-purity nitride film when the upper limit amount is less than the required nitrogen doping amount.

11. The method for producing silicon single crystal according to claim 9, wherein the silicon nitride powder is placed on a silicon wafer and weighed to the upper limit amount or less.

12. The method for producing silicon single crystal according to claim 11, wherein the weighed silicon nitride powder is sandwiched by using another silicon wafer to form a doping agent and nitrogen is doped by adding the doping agent to the raw material before the start of melting.

* * * * *